(12) United States Patent
Inomata et al.

(10) Patent No.: US 7,556,741 B2
(45) Date of Patent: *Jul. 7, 2009

(54) METHOD FOR PRODUCING A SOLAR CELL

(75) Inventors: Yosuke Inomata, Yokaichi (JP); Yuko Fukawa, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/650,505

(22) Filed: Aug. 27, 2003

(65) Prior Publication Data

US 2004/0069412 A1 Apr. 15, 2004

(30) Foreign Application Priority Data

Aug. 28, 2002 (JP) .............................. 2002-249671
Oct. 25, 2002 (JP) .............................. 2002-311820

(51) Int. Cl.
*H01L 21/306* (2006.01)

(52) U.S. Cl. .............................. 216/45; 216/67; 216/79; 257/E21.218

(58) Field of Classification Search ........................ None
See application file for complete search history.

(56) References Cited

U.S. PATENT DOCUMENTS

| | | | |
|---|---|---|---|
| 3,982,976 A | | 9/1976 | Marciniec |
| 4,243,506 A | * | 1/1981 | Ikeda et al. ............ 204/298.31 |
| 4,523,971 A | * | 6/1985 | Cuomo et al. .......... 156/345.39 |
| 4,661,203 A | * | 4/1987 | Smith et al. .................. 438/725 |
| 4,681,780 A | * | 7/1987 | Kamman .................... 427/282 |
| 4,771,213 A | | 9/1988 | Higashinakagawa et al. ..... 313/402 |
| 4,810,322 A | | 3/1989 | Gut et al. |
| 4,842,679 A | * | 6/1989 | Kudo et al. ................. 438/707 |
| 5,015,331 A | * | 5/1991 | Powell ........................ 438/723 |
| 5,171,732 A | * | 12/1992 | Hed ............................ 505/190 |
| 5,177,398 A | | 1/1993 | Engemann |
| 5,223,108 A | * | 6/1993 | Hurwitt ................. 204/192.12 |

(Continued)

FOREIGN PATENT DOCUMENTS

DE 1 621 342 5/1971

(Continued)

OTHER PUBLICATIONS

German language office action and its English language translation for corresponding German application 10340751.0-54 lists the references above, (2008).

(Continued)

*Primary Examiner*—Allan Olsen
(74) *Attorney, Agent, or Firm*—Hogan & Hartson LLP

(57) ABSTRACT

A dry etching apparatus including a plate 15 provided in parallel or nearly parallel with an RF electrode 9 to cover a substrate 1 placed on the RF electrode 9 directly or through a tray 24. The plate 15 is provided with planar or nearly planar obstacles 16 that inhibit a gas and plasma from passing through the plate 15 as well as opening portions 19. This makes it possible to achieve conditions under which etching residues attach to the surface of the substrate faster by trapping the etching residues in a space between the surface of the substrate 1 and the plate 15. Fine textures can be thus formed efficiently on the surface of the substrate (FIG. 4).

24 Claims, 7 Drawing Sheets

U.S. PATENT DOCUMENTS

| | | | |
|---|---|---|---|
| 5,248,371 A | | 9/1993 | Maher et al. |
| 5,254,215 A | * | 10/1993 | Terakado et al. ............. 216/63 |
| 5,304,250 A | * | 4/1994 | Sameshima et al. ... 118/723 ER |
| 5,332,464 A | * | 7/1994 | Namose ........................ 438/9 |
| 5,417,798 A | | 5/1995 | Nishibayashi et al. |
| 5,503,881 A | | 4/1996 | Cain et al. |
| 5,665,167 A | | 9/1997 | Deguchi et al. |
| 5,679,436 A | | 10/1997 | Zhao |
| 5,693,234 A | | 12/1997 | Peters |
| 5,695,564 A | | 12/1997 | Imahashi |
| 5,753,014 A | * | 5/1998 | Van Rijn ........................ 96/12 |
| 5,764,842 A | * | 6/1998 | Aoki et al. .................. 385/131 |
| 5,770,123 A | | 6/1998 | Hatakeyama et al. ...... 264/1.21 |
| 5,868,952 A | | 2/1999 | Hatakeyama et al. ......... 216/66 |
| 5,968,275 A | | 10/1999 | Lee et al. ................ 118/723 R |
| 5,990,016 A | | 11/1999 | Kim et al. |
| 6,087,274 A | * | 7/2000 | Tonucci et al. .............. 438/758 |
| 6,132,805 A | | 10/2000 | Moslehi ................... 427/248.1 |
| 6,171,351 B1 | | 1/2001 | Schroder et al. .............. 51/295 |
| 6,176,967 B1 | * | 1/2001 | Obszarny ................. 156/345.3 |
| 6,214,161 B1 | | 4/2001 | Becker et al. .......... 156/345.48 |
| 6,261,406 B1 | | 7/2001 | Jurgensen et al. ........ 156/345.3 |
| 6,316,289 B1 | * | 11/2001 | Chung ........................ 438/118 |
| 6,413,880 B1 | * | 7/2002 | Baski et al. ................. 438/759 |
| 6,418,941 B1 | | 7/2002 | Arita et al. .................... 134/1.2 |
| 2001/0006169 A1 | | 7/2001 | Hogan et al. |
| 2001/0036744 A1 | | 11/2001 | Taravade et al. |
| 2002/0011215 A1 | | 1/2002 | Tei et al. |
| 2002/0168166 A1 | * | 11/2002 | Itoh et al. ................... 385/129 |
| 2005/0011447 A1 | | 1/2005 | Fink |
| 2005/0241583 A1 | | 11/2005 | Buechel et al. |
| 2005/0251990 A1 | | 11/2005 | Choi et al. |
| 2006/0060138 A1 | | 3/2006 | Keller et al. |

FOREIGN PATENT DOCUMENTS

| | | |
|---|---|---|
| EP | 0 399 998 | 5/1990 |
| JP | 56076242 A | 6/1981 |
| JP | 58-032417 | 2/1983 |
| JP | 59219464 A | 12/1984 |
| JP | 61238981 A | 10/1986 |
| JP | 62047132 A | 2/1987 |
| JP | 62277730 A | 12/1987 |
| JP | 63164433 A | 7/1988 |
| JP | 01119025 A | 5/1989 |
| JP | 02106925 A | 4/1990 |
| JP | 06204181 A | 7/1994 |
| JP | 07500459 A | 1/1995 |
| JP | 08-037097 | 2/1996 |
| JP | 08-232086 | 9/1996 |
| JP | 08274069 A | 10/1996 |
| JP | 09501271 A | 2/1997 |
| JP | 09-102625 | 4/1997 |
| JP | 09283493 A | 10/1997 |
| JP | 09320799 A | 12/1997 |
| JP | 10223736 A | 8/1998 |
| JP | 10280172 A | 10/1998 |
| JP | 11-102880 | 4/1999 |
| JP | 11317396 A | 11/1999 |
| JP | 2000-261008 | 9/2000 |
| JP | 2001127142 A | 5/2001 |
| JP | 2001527288 A | 12/2001 |
| JP | 2002-076404 | 3/2002 |
| WO | 9405035 A1 | 3/1994 |
| WO | 9513525 A1 | 5/1995 |
| WO | 9933097 A1 | 7/1999 |
| WO | 99/56324 | 11/1999 |
| WO | 00/26945 | 5/2000 |
| WO | 0209198 A1 | 1/2002 |

OTHER PUBLICATIONS

Meyers Enzyklopadisches Lexikon, Bd. 10 (German Encyclopedia, vol. 10), p. 401, chapter "Grids".

* cited by examiner

METHOD FOR PRODUCING A SOLAR CELL

This application is based on application Nos. 2002-249671 and 2002-311820 filed in Japan, the content of which is incorporated hereinto by reference.

BACKGROUND OF THE INVENTION

1. Field of the Invention

The invention relates to a dry etching apparatus, a dry etching method, and a cleaning method adopted in the dry etching apparatus, and more particularly to a dry etching apparatus, a dry etching method, and a cleaning method adopted in the dry etching apparatus suitable for use in texturing the surface of a silicon substrate used in a solar cell or the like.

2. Description of the Related Art

A solar cell is an element that converts incident light energy into electrical energy. The solar cell is classified into crystal-based, amorphous-based, and compound-based solar cells depending on materials used. Among others, crystalline silicon solar cells account for a large percentage of the solar cells currently available on the market. The crystalline silicon solar cell is further classified into a single-crystalline silicon type and a multi-crystalline silicon type. A silicon solar cell of a single-crystal type has an advantage that efficiency can be readily improved due to the substrate of high quality, but has a drawback that the manufacturing cost of the substrate is high. On the contrary, a multi-crystalline silicon solar cell has a drawback that efficiency cannot be readily improved due to the substrate of inferior quality, but has an advantage that the manufacturing cost is low. In addition, improvement in quality of the multi-crystalline silicon substrate and advancement in the cell fabrication technique in recent years made it possible to achieve conversion efficiency of approximately 18% in the research level.

On the other hand, while multi-crystalline silicon solar cells have been available on the market because they can be manufactured at a low cost through mass-production, the demand is now on the increase due to growing concern about environmental issues in recent years, and there is a need to achieve higher conversion efficiency at a low cost.

There have been made many attempts regarding solar cells to improve conversion efficiency to electrical energy. One of such attempts relates to a technique to reduce reflection of light incident on the substrate, by which conversion efficiency to electrical energy can be improved by reducing reflection of light on the surface.

In a case where a solar cell is fabricated from a silicon substrate, reflection can be reduced to some extent by etching the surface of the substrate with alkaline aqueous solution, such as sodium hydroxide, to form fine textures (concavities and convexities) on the surface of the substrate. In a case where a single-crystalline silicon substrate having a (100)-plane orientation, a group of myriads of pyramids called a texture structure can be formed on the surface of the substrate by the method described above.

Etching with the use of alkaline aqueous solution, however, depends on the plane orientation of crystals, and for this reason, in a case where a solar cell is fabricated from a multi-crystalline silicon substrate, a group of pyramids cannot be formed homogeneously, which raises a problem that overall reflectance cannot be reduced effectively. When the textures cannot be formed homogeneously, incident light cannot be taken into the solar cell effectively, and the solar cell has little hope of improving photoelectrical conversion efficiency.

In order to eliminate such a problem, there has been proposed an idea of texturing the surface by forming fine textures through the reactive ion etching method when a solar cell element is fabricated from multi-crystalline silicon (see Japanese Laid-Open Patent Application No. 102625/1997, etc.). In other words, this idea is to reduce reflectance of a solar cell using multi-crystalline silicon more effectively by forming fine texture homogeneously on multi-crystalline silicon regardless of anomalous plane orientations of the crystals.

A substrate processing apparatus used in the reactive ion etching method is generally of a parallel plate counter-electrode type, wherein an RF voltage plate is provided on the side where the substrate is placed and the electrode on the other side and the internal sidewall are connected to ground. The interior of the chamber is evacuated, then the substrate is added by the RF voltage and is subjected to plasma etching while a constant pressure is maintained by introducing an etching gas, and a pressure in the interior of the chamber is restored to atmospheric pressure after the etching is completed.

Because of the procedure described above, waiting times for evacuation and leaking to atmospheric pressure are long in a reactive ion etching apparatus. Moreover, the area of the solar cell itself is large. Hence, there is a problem that the manufacturing cost of a solar cell is increased because only a small number of substrates can be processed at a time.

Accordingly, in the case of using a reactive ion etching apparatus in the fabrication sequence of a solar cell, a way in which the number of substrates to be processed at a time is increased at high tact while ensuring homogeneity of textures formed the surface of the substrate, or a way in which the area of a substrate to be processed is increased is crucial.

The invention was devised in view of the foregoing problems in the related art, and has an object to provide a dry etching apparatus and a dry etching method, making it possible to form textures efficiently and homogeneously on the surface of a substrate, for example, a silicon substrate used in a solar cell.

The invention has another object to provide a dry etching apparatus, a dry etching method, and a cleaning method adopted in the dry etching apparatus, making it easier to clean a plate covering the surface of a substrate during etching.

BRIEF SUMMARY OF THE INVENTION

Basically, components of a substrate evaporate when the substrate is etched, part of which, however, does not evaporate completely and molecules bond to one another, thereby being left as residues on the surface of the substrate. In the invention, when the surface of the substrate is textured through the dry etching method, the surface is textured by accelerating a rate at which residues, composed of components of the etched substrate, re-attach to the surface of the substrate, so that textures are formed on the surface of the substrate by using the residues as a micro-mask for etching.

A dry etching apparatus of the invention includes: a chamber; an RF electrode provided inside the chamber; and a plate provided in parallel or nearly parallel with the RF electrode to cover a substrate to be etched, placed on the RF electrode directly or through a tray, wherein the plate is provided with a planar or nearly planar obstacle that partly inhibits a part of gas and plasma from passing through the plate.

A dry etching method of the invention for forming a texture surface of the substrate through etching comprises placing a substrate to be etched on an RF electrode provided inside a chamber, directly or through a tray, and covering the substrate to be etched with a plate, wherein the plate is provided with a planar or nearly planar obstacle that inhibits a part of gas and plasma from passing through the plate.

As has been described, according to the inventions, dry etching is performed by covering above the substrate to be etched with the plate provided with a planar or nearly planar obstacle that inhibits a part of gas and plasma from passing through the plate. It is thus possible to achieve conditions under which etching residues attach to the surface of the substrate faster by trapping the etching residues in a space between the surface of the substrate and the plate. Because etching can be performed while allowing the etching residues to attach to the surface of the substrate, a texture can be formed on the surface of the substrate at markedly high efficiency in comparison with the conventional case. At the same time, the homogeneity of the textures in a batch is improved, which makes it possible to increase the number of substrates to be processed at a time. It is thus possible to form fine textures on the surface of a substrate, or namely a textured surface, needed in a high efficient solar cell or the like, at high tact and at a lower cost.

When etching is performed by covering a substrate to be etched with a plate provided with a number of opening portions, the etching residues attach to the surface of the substrate to be etched, and at the same time, the etching residues attach to the plate covering the substrate, on the surface opposing the substrate. While etching is performed repetitively, a quantity of residues attaching to the plate is increased to the extent that the residues start to fall on the substrate in the form of powder particles. The particles thus dropped form an etching mask, and the masked portion is left intact without being etched, which raises a problem that the homogeneity of the textures cannot be ensured.

In order to avoid such a problem, the plate needs to be cleaned periodically. The etching residues can be readily cleaned through a wet etching method using a solution of acids or alkali. However, when the apparatus is upsized to increase the number of substrates to be processed at a time, the plate is upsized correspondingly, and a cleaning bath as large as the dry etching apparatus is required. Also, the need to handle dangerous cleaning liquid raises a problem.

A dry etching apparatus of the invention therefore includes: a chamber; an RF electrode provided inside the chamber; and a plate provided with a number of opening portions and provided in parallel or nearly parallel with the RF electrode to cover a substrate to be etched, placed on the RF electrode directly or through a tray, wherein the plate is structured in such a manner that a surface and a back surface can be reversed.

Also, a dry etching method of the invention comprises placing a substrate to be etched on an RF electrode provided inside a chamber, directly or through a tray, and covering the substrate to be etched with a plate provided with a number of opening portions, wherein a surface of the substrate to be etched is textured through etching and the plate is cleaned on a surface side concurrently.

Because both the surface and the back surface of the plate can be used as described above, it is possible to dry-clean the plate at the same time while surface texturing are performed on the substrate. Hence, the surface of a substrate can be textured at high tact, while it is possible to eliminate the need to clean the plate with chemical liquid, using a large-scaled cleaning bath or dangerous chemicals.

A cleaning method of the invention adopted in a dry etching apparatus for cleaning a surface of a plate comprises: carrying out a substrate from a chamber; placing a plate provided with a number of opening portions inside the chamber; and introducing an etching gas inside the chamber.

According to this cleaning method, because the plate is cleaned by activating the dry etching apparatus after the substrate is carried out, it is no longer necessary to dip the plate in a large-scaled cleaning bath with the use of dangerous chemical liquid, and the plate can be thus cleaned safely.

BRIEF DESCRIPTION OF THE DRAWINGS

FIG. 5 shows a plan view and a cross section showing an example when obstacles 16 comprise parallel bar-shaped members 16a;

FIG. 8A is a cross section showing an example when the obstacles 16 comprise a plurality of parallel elongate sheet members 16d aligned with a clearance in between;

DETAILED DESCRIPTION OF THE INVENTION

The following description will describe embodiments of the invention in detail with reference to the accompanying drawings.

Figure 1:
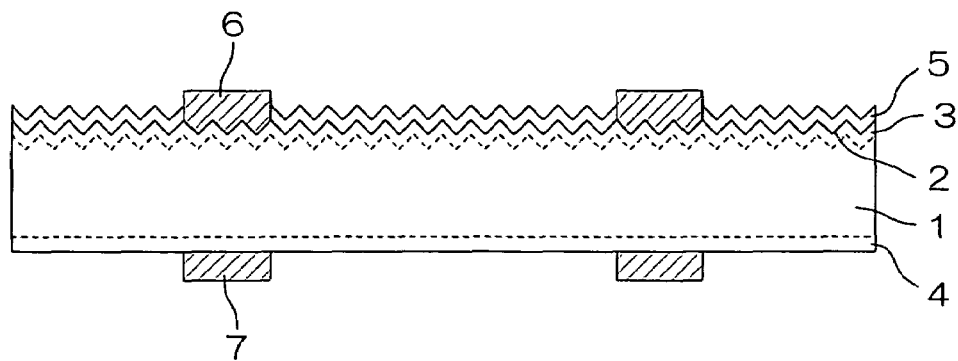
FIG. 1 is a view showing a cross-sectional structure of a solar cell fabricated with the use of a dry etching apparatus of the invention.

FIG. 1 is a view showing a structure of a solar cell fabricated with the use of a dry etching apparatus of the invention.

Referring to FIG. 1, numeral 1 denotes a silicon substrate, numeral 2 denotes textures formed on the silicon substrate 1, numeral 3 denotes an impurity diffusing layer on the light-reception surface side, numeral 4 denotes an impurity diffusing layer (BSF) on the back surface side of the silicon substrate 1, numeral 5 denotes a surface anti-reflection layer, numeral 6 denotes a surface electrode, and numeral 7 denotes a back surface electrode.

The silicon substrate 1 is a single-crystalline or multi-crystalline silicon substrate. The substrate is either of a p-type or an n-type. The silicon substrate 1 is formed through the Czochralski method or the like in the case of single-crystalline silicon, and through casting process or the like in the case of multi-crystalline silicon. Multi-crystalline silicon is quite advantageous over single-crystalline silicon in terms of the manufacturing costs because it can be mass-produced. An ingot made through the Czochralski method or the casting processing is sliced at a thickness of approximately 300 μm, and cut into a silicon substrate of a size of approximately 10 cm×10 cm or 15 cm×15 cm.

On the surface side of the silicon substrate 1 are formed the impurity diffusing layer 3 in which another type impurity against to the substrate is diffused and the anti-reflection layer 5. It is preferable to form the layer (BSF) 4 in which one conduction type semiconductor impurity is diffused at a high concentration on the back surface side of the silicon substrate 1. The surface electrode 6 and the back surface electrode 7 are formed respectively on the surface side and the back surface side of the silicon substrate 1. The surface electrode 6 and the back surface electrode 7 are formed by sintering screen-printed Ag paste and by forming a solder layer on the top.

The textures 2 are formed as follows. That is, a gas is kept introduced into an evacuated chamber to maintain a constant pressure, and plasma is generated by applying RF voltage to the electrode provided inside the chamber. The surface of the substrate is then etched by the action of resulting activated seeds, such as ions and radicals. This method is referred to as the reactive ion etching (RIE) method, and will now be described with reference to FIG. 2 and FIG. 3.

Figure 2:
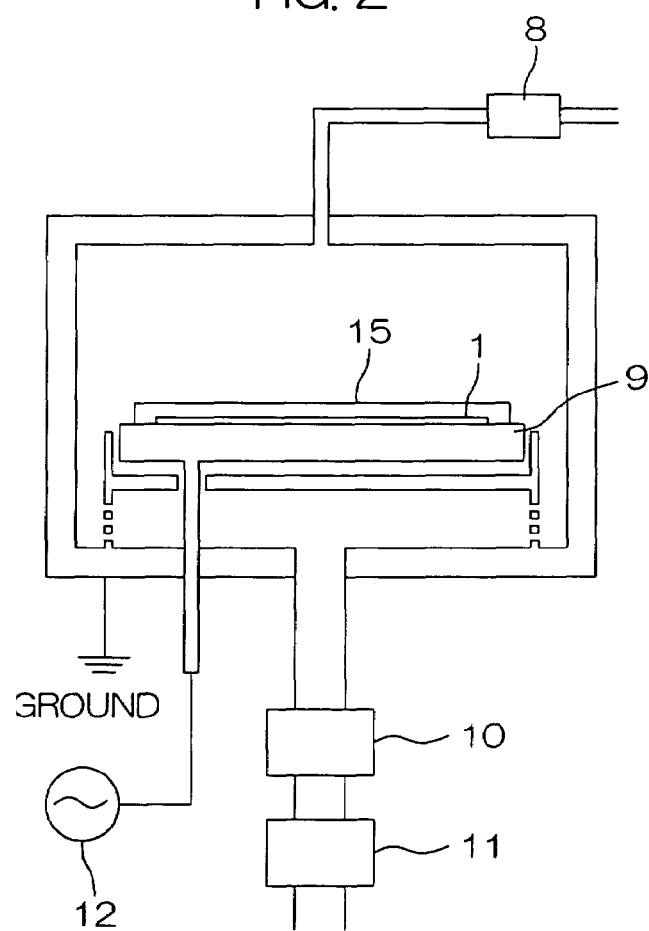
FIG. 2 is a view showing a basic structure of the dry etching apparatus.
Figure 3:
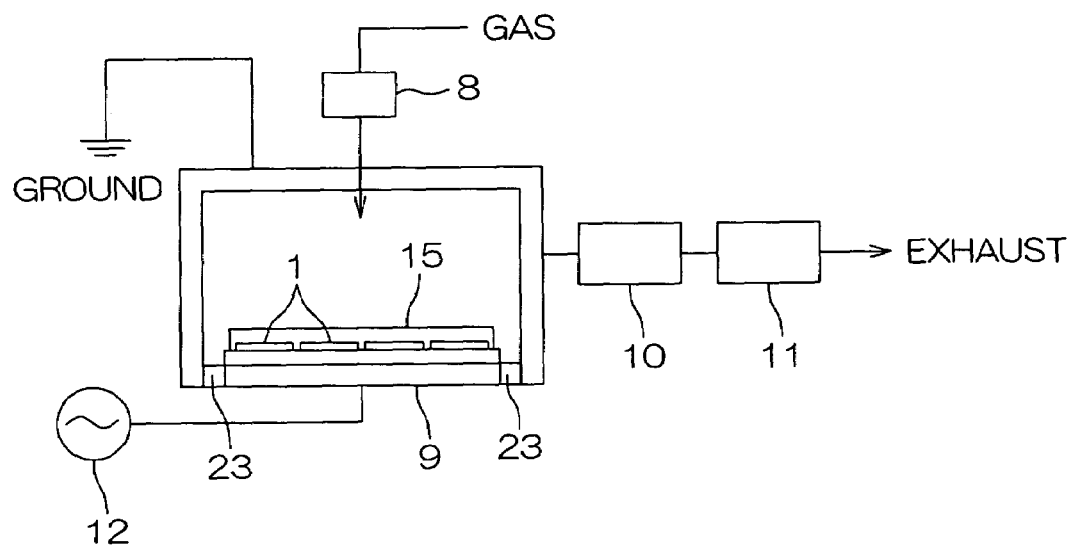
FIG. 3 is a view showing another basic structure of the dry etching apparatus.

Referring to FIG. 2 and FIG. 3, numeral 1 denotes a silicon substrate, numeral 8 denotes a massflow controller, numeral 9 denotes an RF electrode, numeral 10 denotes a pressure controller, numeral 11 denotes a vacuum pump, and numeral 12 denotes an RF power supply. Referring to FIG. 3, in particular, numeral 23 denotes an insulation portion that electrically isolates the RF electrode 9 from other outside walls.

Plasma is generated by introducing a gas necessary for etching into the apparatus by the massflow controller 8 while supplying RF power from the RF electrode 9 to excite and activate ions and radicals, and the surface of the silicon substrate 1 placed on the top portion of the RF electrode 9 is etched by the action of the ions and radicals. According to the apparatus shown in FIG. 2, the surface of a single large-area silicon substrate 1 is etched by providing the RF electrode 9 inside the apparatus. On the contrary, according to the apparatus shown in FIG. 3, the surfaces of a plurality of silicon substrates 1 are etched concurrently by providing the RF electrode 9 on the outside wall of the apparatus.

A method in which, of all the generated active seeds, the effect of etching by the action of ions is enhanced is generally referred to as the reactive ion etching method. The plasma etching method is known as a similar method. The reactive ion etching method and the plasma etching method are basically the same in the principle of generating plasma, and different merely in distributions of the kinds of active seeds acting on the substrate, and the distributions are changed depending on the chamber structure, the electrode structure, a generation frequency or the like. The invention, therefore, is effective not only to the reactive ion etching method, but also to the plasma etching method in general.

In this invention, for example, etching is performed for approximately three minutes at a reaction pressure of 7 Pa and at plasma-generating RF power of 500 W while 20 sccm of methane trifluoride ($CHF_3$), 50 sccm of chlorine ($Cl_2$), 10 sccm of oxygen ($O_2$), 80 sccm of sulfur hexafluoride ($SF_6$) and in addition to them 1 sccm of $H_2O$ are kept flown. The textures 2 are thereby formed on the surface of the silicon substrate 1. Basically, silicon evaporates when it is etched, part of which, however, does not evaporate completely and molecules bond to one another, thereby being left as residues on the surfaces of the substrate 1. In other words, in the invention, when the surface of the silicon substrate 1 is textured through the reactive ion etching method and a similar dry etching method, a rate at which etching residues, chiefly composed of etched silicon, re-attach to the surface of the silicon substrate 1 is accelerated, so that the textures 2 are formed on the surface of the silicon substrate 1 by using the residues as a micro-mask for etching. It should be noted that the etching residues are removed in the end.

Also, the textures 2 can be formed in a reliable manner by setting a gas condition, a reaction pressure, RF power, etc. to comply with the conditions such that the etching residues of silicon will be left on the surface of the silicon substrate 1. It should be noted, however, that an aspect ratio of the textures 2 needs to be optimized. Conversely, it is difficult to form the textures 2 under condition that the etching residues will not be left on the surface of the silicon substrate 1.

<Structure 1 of Plate>

In the invention, a plate 15 is disposed between the silicon substrate 1 and an anode 18 to cover the silicon substrate 1. By performing etching while the silicon substrate 1 is covered with the plate 15 in this manner, it is possible to promote the formation of residues on the silicon substrate 1, which in turn promotes the formation of the surface texture 2.

Figure 4:
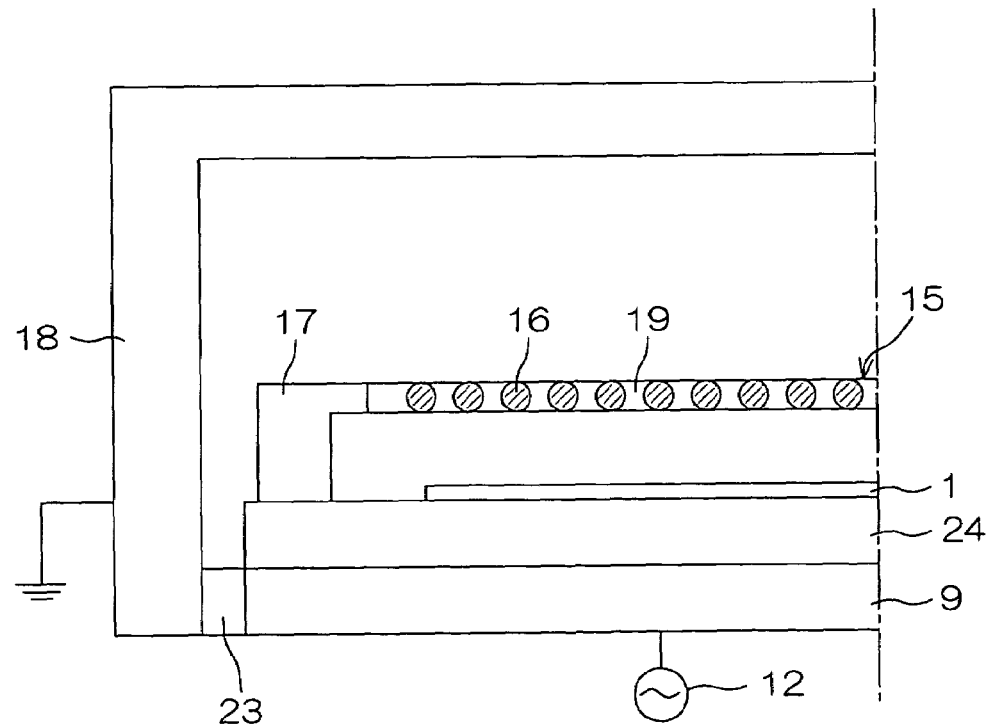
FIG. 4 is an enlarged view showing the internal structure of the dry etching apparatus.

An explanation will be given with reference to FIG. 4. FIG. 4 is an enlarged view of the interior of the dry etching apparatus. Referring to FIG. 4, numeral 1 denotes a silicon substrate to be etched, numeral 9 denotes an RF electrode to be used as a cathode, numeral 15 denotes a plate provided to cover the silicon substrate 1, and numeral 16 denotes obstacles provided in the plate 15. Opening portions 19 are formed between neighboring obstacles 16. Numeral 17 denotes a sidewall used to hold the plate 15, numeral 18 denotes a chamber wall to be used as an anode, and numeral 23 denotes an insulator that electrically isolates the chamber wall 18 from the RF electrode 9.

The chamber wall 18 is grounded and thereby servers as the anode. A tray 24 is provided on the RF electrode 9 to be used as the cathode, and the silicon substrate 1 to be etched is placed thereon. Plasma is generated by applying an RF voltage from the RF electrode 9 while introducing a gas inside the chamber 14 to excite and activate ions and radicals, and the surface of the silicon substrate 1 on the tray 24 provided on the RF electrode 9 is thereby etched.

The plate 15 supported by the sidewall 17 is provided with the obstacles 16 as well as the opening portions 19. A gas and plasma pass through the opening portions 19. The opening pattern of the opening portions 19 is not especially limited. It should be noted, however, that the presence of a non-opening portion of a large area gives rise to unevenness in etching.

An example of a structure of the obstacles 16 in the plate 15 will now be explained more in detail with reference to FIG. 5 through FIG. 7.

Figure 5:
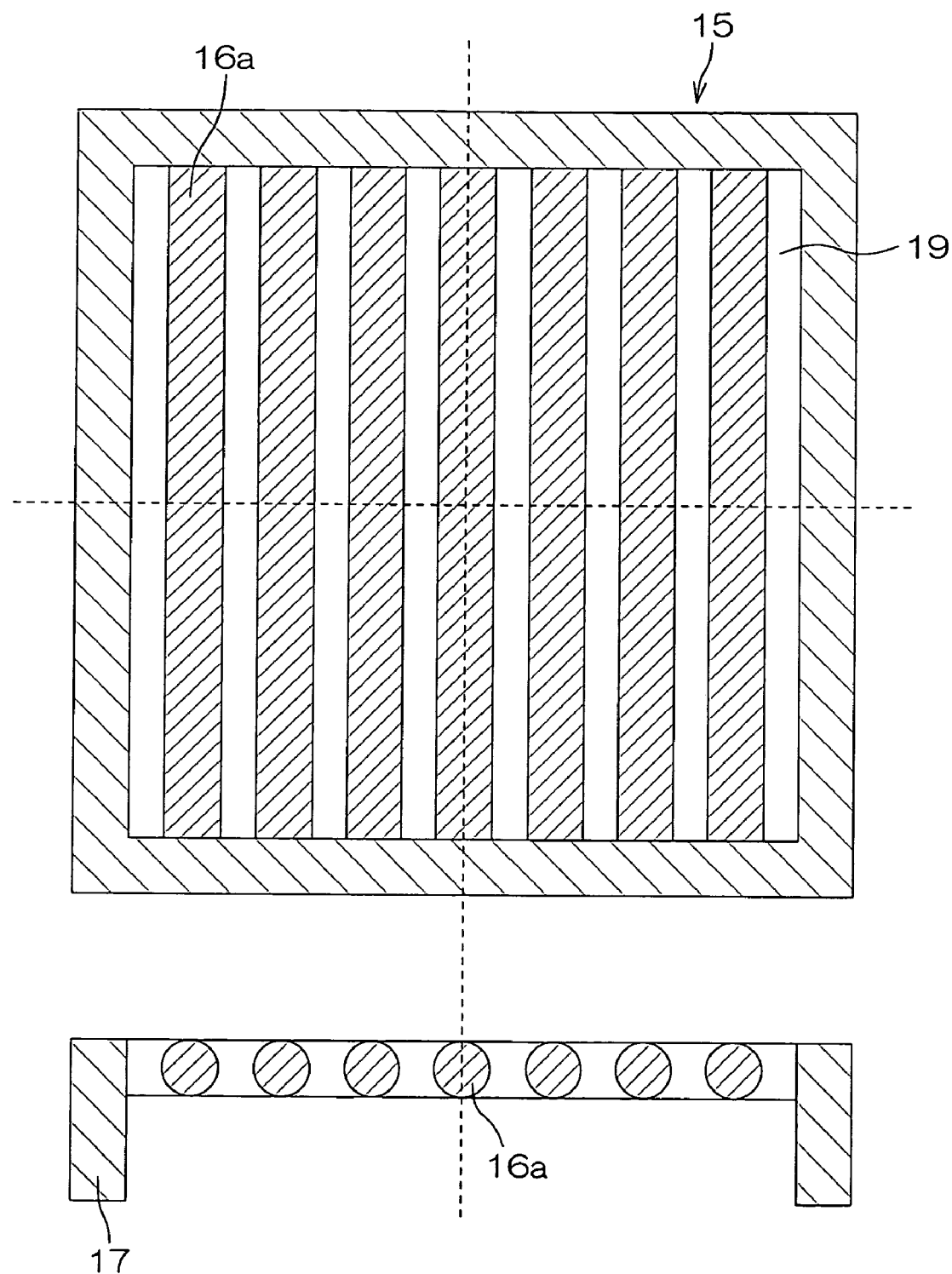

FIG. 5 shows a plane view and a cross section of an example when the obstacles 16 comprise parallel bar-shaped members 16a. A plurality of bar-shaped members 16a are fit inside a square frame of the plate 15. Numeral 17 denotes the sidewall. The plate 15 is formed as a flat or nearly flat plate from the bar-shaped members 16a, and clearances are used as the opening portions 19, through which a gas and plasma are allowed to pass through. Opening portions may be formed by providing holes in the bar-shaped members 16 per se.

Figure 6:
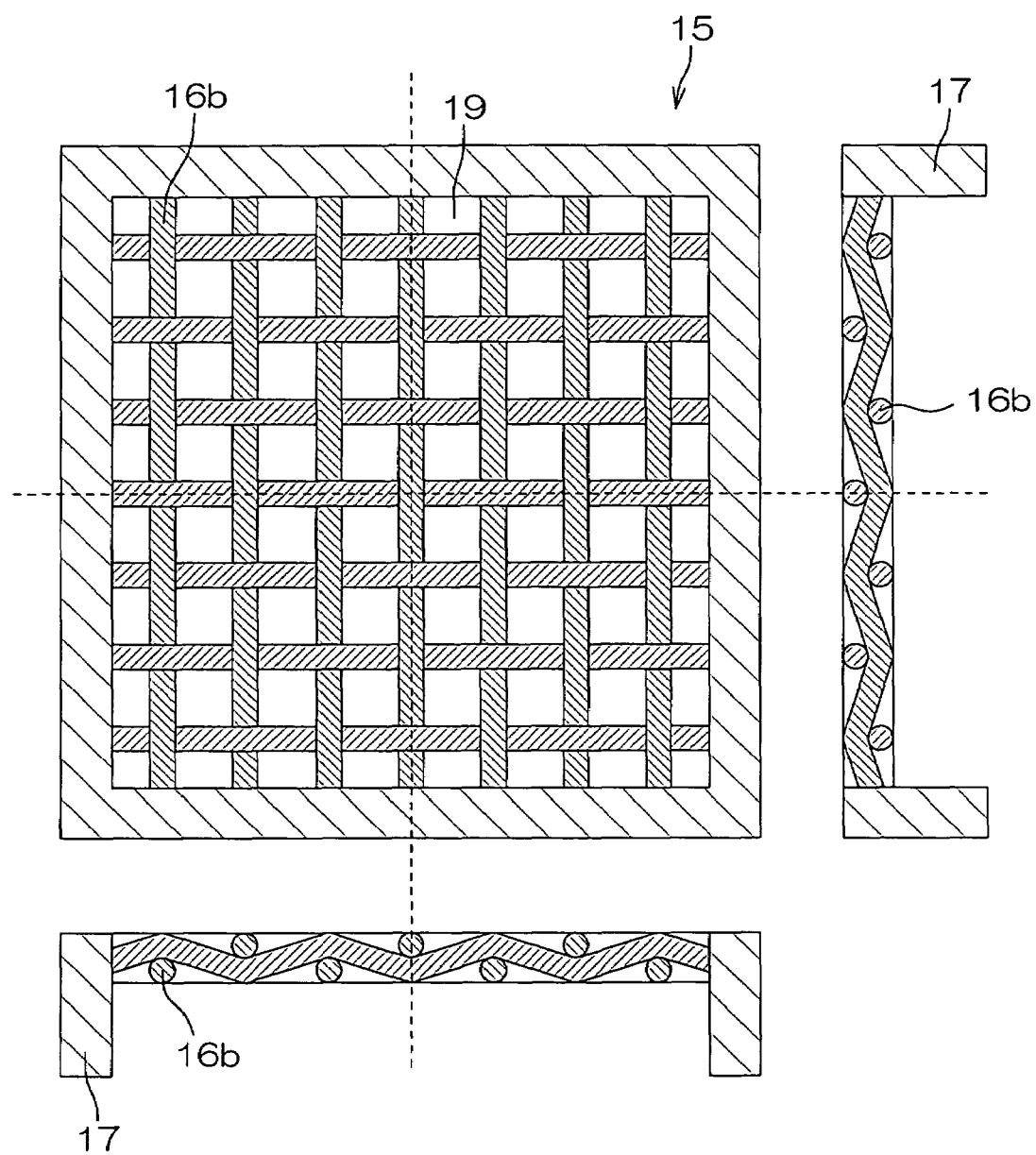
FIG. 6 shows a plan view and a cross section when the obstacles 16 comprise mesh members 16b.

FIG. 6 shows a plane view and a cross section when the obstacles 16 comprise mesh members 16b. The mesh members 16b are woven by crossing longitudinal members and lateral members over and under with each other. By adopting the mesh members 16b, each opening portion 19 forms a rectangular shape. Because a larger number of the opening portions 19 are provided and the area of each opening portion 19 is reduced in comparison with the case of FIG. 5, it is possible to reduce the occurrence of unevenness in etching. Also, because a mesh structure is adopted, even when the individual members 16b are made thinner and a poor quality of material is used, overall strength can be ensured.

Figure 7:
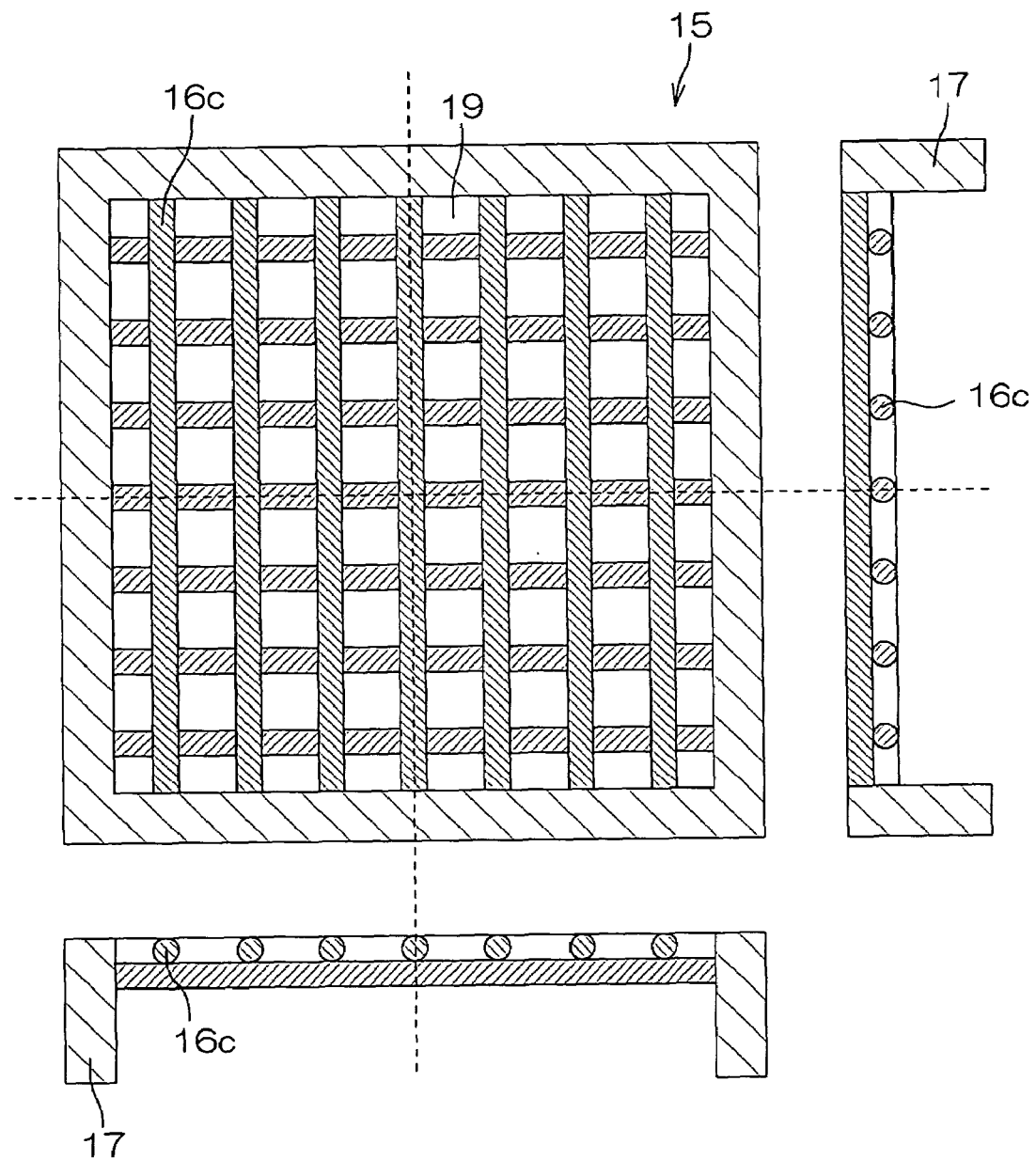
FIG. 7 shows a plan view and a cross section when grid-like members 16c are adopted as the obstacles 16.

FIG. 7 shows a plane view and a cross section when grid-like members 16c are adopted as the obstacles 16. The grid-like members 16c form a double-layer structure, in which a plurality of longitudinal members aligned in parallel are provided on a plurality of lateral members aligned in parallel. As is with FIG. 6, each opening portion 19 forms a rectangular shape, and because a large number of the opening portions 19 are provided, it is possible to reduce the occurrence of unevenness in etching.

The obstacles 16 may comprise a combination of any of the forming members 16a through 16c as described above.

The cross-sectional shapes of the respective members forming the obstacles 16 are note specially limited. For example, the respective members forming the obstacles 16 shown in FIG. 5 through FIG. 7 are shaped like circular columns; however, the respective members may have a cross section of a square column.

Further, in a case where the respective members are reduced in thickness and made into an elongate sheet or an elongate film, the thickness of the obstacles 16 is reduced, and so is an overall thickness of the plate 15. A volume of the etching chamber 14 can be thus reduced. Also, because the plate 15 is formed as a nearly flat plate, an abnormal discharge seldom occurs during etching.

Figure 8A:
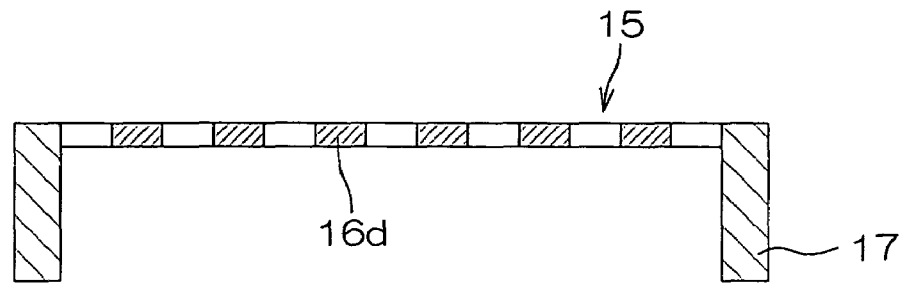
Figure 8B:
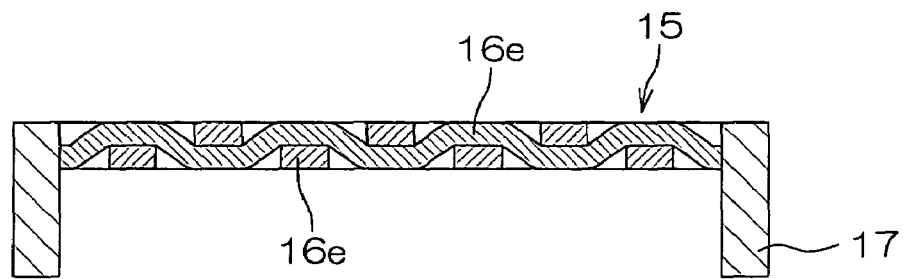
FIG. 8B is a cross section showing an example when the obstacles 16 comprise a mesh woven by crossing a plurality of elongate sheet members 16e over and under with each other.
Figure 8C:
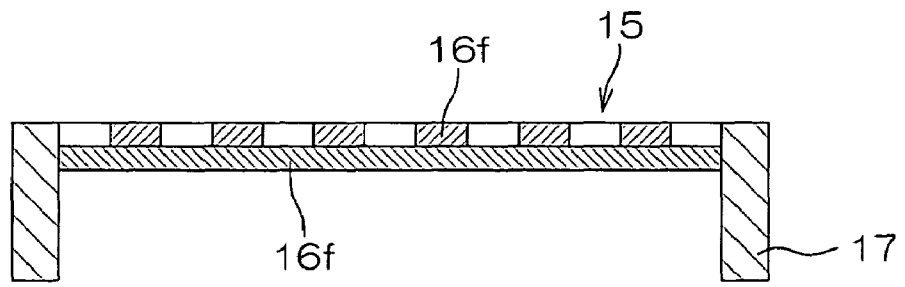
FIG. 8C is a cross section showing an example when a plurality of elongate sheet members 16f aligned with a clearance in between are laminated in directions intersecting at right angles to be used as the obstacles.

FIG. 8A, FIG. 8B, and FIG. 8C are cross sections when obstacles 16 comprise flat elongate members. FIG. 8A shows an example when the obstacles 16 comprise a plurality of parallel elongate sheet members 16d aligned with a clearance in between. FIG. 8B is an example when the obstacles 16 comprise a plurality of elongate sheet members 16e woven into a mesh. FIG. 8C shows an example when a plurality of elongate sheet members 16f aligned with a clearance in between are layered in directions intersecting at right angles.

Further, when the obstacles 16 comprise thin wire members, obstacles 16 become easy to process and the weight can be reduced further.

Materials of the plate 15 and the obstacles 16 are not especially limited, and metal, glass, and resin would be good examples. It should be noted, however, that of all metals, a stainless-based material is not suitable when a stainless-based material corrodes in order to exposed to a gas used to etch silicon.

Metal is preferable as a material of the plate 15 when the readiness in processing is concerned. In particular, when an etching area is large, it is preferable to use metal because glass is so brittle that it readily breaks. In this case, an aluminum-based material is most preferable.

On the other hand, the plate 15 heats because it is exposed to plasma during etching, and the temperature of the plate 15 rises. Hence, in a case where the plate 15 is exposed to high-temperature plasma, a glass-based material that can withstand a high temperature is preferable.

According to the fabrication sequence, once the surface texture 2 of the silicon substrate 1 is formed, the silicon substrate 1 is taken out in atmosphere. Hence, a material that can withstand a temperature difference is preferable for the plate 15.

As has been described, it is necessary to select preferable materials depending on the etching conditions.

It is possible to combine a plurality of materials. For example, in the case of the mesh members 16b of FIG. 6, the longitudinal members of the mesh may be formed linearly from a material that is not easy to process, for example, a glass-based material, and members made of a material that is easy to process, for example, an aluminum-based material or a resin-based material like Teflon, are crossed over and under the longitudinal members in the lateral direction. In the case of the structure of FIG. 7, the lower layer may be made of an aluminum-based member and the top layer may be made of a glass-based member.

In a case where the obstacles 16 per se are made of a material that transmits neither a gas nor plasma, it is preferable to set an open area ratio of the opening portions 19 to 5 to 40%. When the open area ratio of the opening portions 19 is less than 5%, a gas needed to etch silicon is not supplied sufficiently and a residue forming rate is reduced, which in turn slows down the formation of the surface texture 2 of the silicon substrate 1. Conversely, when the open area ratio of the opening portions 19 exceeds 40%, the effect of trapping silicon compounds, generated and evaporating during etching, within a space between the silicon substrate 1 and the plate 15 is reduced, and so is the effect of promoting residue formation.

When the obstacles 16 are made of materials that can transmit a gas and plasma, the opening portions 19 are not necessarily provided.

When the silicon substrate is etched with the use of the dry etching apparatus described as above, it is preferable to perform etching while a distance of 5 mm to 30 mm is maintained between the plate 15 and the silicon substrate 1. When arranged in this manner, there can be achieved an effect that the silicon compounds generated during etching are trapped within a space between the silicon substrate 1 and the plate 15, which makes it easier for the residues, chiefly composed of silicon, to be formed on the silicon substrate 1. Hence, not only the formation of the residues, but also the formation of the surface texture 2 can be promoted at the same time. When a distance between the plate 15 and the silicon substrate 1 is less than 5 mm, the opening portions 19 in the plate 15 are transferred as a pattern on the surface of the silicon substrate 1 when the surface texture 2 is formed, thereby leaving unevenness on the surface. Conversely, when a distance exceeds 30 mm, the effect of promoting the formation of the surface texture 2 by generating the residues is reduced.

A method of maintaining a distance between the plate 15 and the silicon substrate 1 is not especially limited. For example, as shown in FIG. 4 through FIG. 7, a simple method is to maintain a distance by providing the sidewall 17 to the plate 15.

The structure of the plate 15 of the invention aims to improve the forming rate of the surface texture 2 by promoting the generation of residues to be used as a mask for etching that is needed when the surface texture 2 is formed on the silicon substrate 1. However, there is a large side effect that the surface texture 2 of the silicon substrate 1 is formed homogeneously on the surface of the silicon substrate 1. This is particularly advantageous when the area of a substrate is large.

<Structure 2 of Plate>

Figure 9:
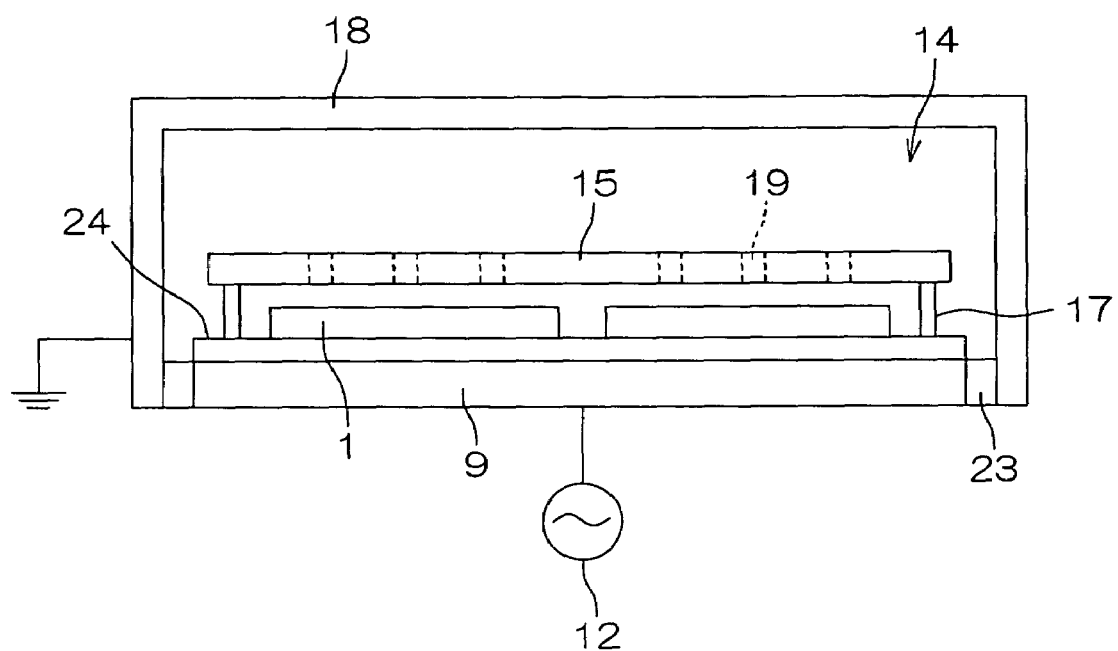
FIG. 9 is a cross section showing a structure of a dry etching apparatus provided with a plate 15 of the invention.

FIG. 9 is a cross section showing one example of a structure of a dry etching apparatus provided with a plate 15 of the invention. Referring to FIG. 9, numeral 1 denotes a silicon substrate, numeral 9 denotes an RF electrode, numeral 12 denotes an RF power supply, numeral 14 denotes a chamber, numeral 24 denotes a tray, numeral 15 denotes a plate, numeral 17 denotes an attachment member, numeral 23 denotes an insulator that electrically isolates a chamber wall 18 from the RF electrode 9.

The plate 15, provided with a number of opening portions 19, is placed to cover the silicon substrate 1 from above. The plate 15 maintains a certain distance from the silicon substrate 1 by using the attachment member 17 as a spacer. It is thus possible to trap residues to be used as a mask when the silicon substrate 1 is etched in a space between the plate 15 and the substrate 1, which in turn makes it possible to promote the generation of textures on the silicon substrate 1. When the texture forming rate is improved, the homogeneity of etching in a batch is improved, too, and the number of substrates to be processed at a time can be increased.

According to this method, however, the etching residues attach not only to the surface of the silicon substrate 1, but also to the plate 15 provided over the substrate 1, on the surface opposing the substrate 1, at the same time.

In the invention, the plate 15 is dry-cleaned inside the dry etching apparatus to remove such etching residues. In other words, a gas is introduced while the silicon substrate 1 is not transported in the chamber 14, and plasma is generated by introducing RF power from the RF electrode 9 to excite and activate ions and radicals, which act on the surface of the plate 15 and thereby remove the etching residues attaching thereto.

In this instance, it is preferable to structure the plate 15 in such a manner that it is removed from the attachment member 17, and re-attached inversely. When structured in this manner, the surface of the plate 15 onto which the etching residues are attaching can be cleaned while being placed oppositely to the anode 18. A cleaning speed of the etching residues can be thus improved.

Further, it is preferable that the surface and the back surface of the plate 15 are of substantially the same shape. When arranged in this manner, either the surface or the back surface of the plate 15 can be used. The plate 15 can be thus used repetitively while being reversed.

A reversing method will now be described in detail with reference to FIG. 9. Assume that a plane A is the surface of the plate 15 opposing the silicon substrate 1, and a plane B is the surface on the opposite side. Then, when the surface of the silicon substrate 1 is textured by forming the textures thereon, residues attach to the plane A of the plate 15. Then, by reversing the surface and the back surface of the plate 15 so that the plane B opposes the silicon substrate 1, there will occur no problem that the residues drop on the silicon substrate 1 because the residues have not attached to the plane B from the start. Further, the plane A opposing the anode 18 in this instance is exposed to an etching gas and plasma, and the residues attaching to the surface of the plane A are therefore etched by the action of the etching gas and plasma. In short, the surface texturing of the silicon substrate 1 and the cleaning of the plate 15 can be performed concurrently, and the plate 15 can be used repetitively while being reversed.

While the embodiments of the invention have been described, the invention is not limited to the embodiments above. For example, a holding method of the plate 15 is not especially limited as long as a certain distance can be secured from the substrate 1. Also, an explanation was given to the apparatus of a lateral parallel plate type; however, the invention is not limited to this structure. Also, an explanation was given to the bulk silicon solar cell as an example of the substrate to be etched; however, the invention can be applied to an amorphous silicon solar cell, a thin-film solar cell, etc. Further, applications of the invention are not limited to a silicon substrate or the substrate in a solar cell, and the invention can be also applied to a substrate made of any of glass, metal, plastic, and resin.

The invention claimed is:

1. A method for producing a solar cell comprising:
    placing a substrate for a solar cell on an RF electrode provided inside a chamber, directly or through a tray;
    covering said substrate with a plate, wherein said plate is not in direct contact with said substrate, wherein said plate comprises an obstacle with a plurality of obstacle forming members that inhibit a part of gas and plasma from passing through said plate; and
    forming textures on a surface of said substrate by using residues, wherein said residues chiefly comprise components of said substrate.

2. The method for producing a solar cell according to claim 1, wherein said substrate is made of silicon.

3. The method for producing a solar cell according to claim 1, wherein said plate covers said substrate while a distance of 5 mm to 30 mm is between the substrate and plate.

4. The method for producing a solar cell according to claim 1, wherein said obstacle forming member comprises a mesh woven by crossing plurality of long members over and under with each other.

5. The method for producing a solar cell according to claim 1, wherein an opening portion is provided between neighboring obstacle forming members.

6. The method for producing a solar cell according to claim 5, wherein an open area ratio of said obstacle is 5 to 40%.

7. The method for producing a solar cell according to claim 1, wherein said obstacle forming members are a plurality of long members aligned with a clearance in between.

8. The method for producing a solar cell according to claim 7, wherein said long member is a bar-shaped or sheet member.

9. The method for producing a solar cell according to claim 1, wherein said obstacle comprises a plurality of obstacles of a stacked structure.

10. The method for producing a solar cell according to claim 9, wherein said obstacle comprises a member formed by stacking a plurality of long members aligned with a clearance in between, in different directions.

11. The method for producing a solar cell according to claim 1, wherein said obstacle forming member is made of one kind or a combination of two or more kinds selected from a group consisting of materials (a), (b), and (c) as follows:
    (a) a glass-based material;
    (b) a metal material; and
    (c) a resin material.

12. The method for producing a solar cell according to claim 11, wherein said metal material is an aluminum-based material.

13. A method for producing a solar cell, comprising:
    placing a substrate on an RF electrode provided inside a chamber, directly or through a tray;
    covering said substrate with a plate, wherein said plate is not in direct contact with said substrate, said plate being provided with a number of opening portions, wherein said plate inhibits a part of gas and plasma from passing through said plate; and
    etching the substrate by a reactive ion etching method;
    wherein textures are formed on a surface of said substrate by using residues, wherein said residues chiefly comprise components of said substrate, and said plate is cleaned on a surface side concurrently.

14. The method for producing a solar cell according to claim 13, wherein said plate is structured in such a manner that a surface and a back surface can be reversed.

15. The method for producing a solar cell according to claim 14, wherein the surface and the back surface of said plate are of substantially a same shape.

16. A method for producing a solar cell comprising:
    placing a first substrate for a solar cell on an RE electrode provided inside a chamber, directly or through a tray;
    covering said first substrate with a plate, wherein said plate is not in direct contact with said first substrate, said plate being provided with a number of opening portions;

forming textures on a surface of said first substrate and cleaning said plate on a surface side concurrently, placing a second substrate inside the chamber, with said plate positioned such that the surface side and a back surface side thereof being reversed after said plate is cleaned on the surface side, and forming textures on a surface of said second substrate.

17. The method for producing a solar cell according to claim 16, wherein said first and second substrates are etched by a reactive ion etching method.

18. A method for producing a solar cell comprising:

placing a substrate for a solar cell on an RF electrode provided inside a chamber, directly or through a tray;

covering said substrate with a plate, wherein said plate is not in direct contact with said substrate, said plate being provided with a number of opening portions, wherein said plate inhibits a part of a gas and plasma from passing through said plate; and forming textures on a surface of said substrate by using residues, wherein said residues chiefly comprise components of said substrate.

19. The method for producing a solar cell according to claim 18, wherein an open area ratio of said obstacle is 5 to 40%.

20. The method for producing a solar cell according to claim 18, wherein said substrate is made of silicon.

21. The method for producing a solar cell according to claim 18, wherein said plate covers said substrate while a distance of 5 mm to 30 mm is between the substrate and plate.

22. The method for producing a solar cell according to claim 18, wherein said substrate is etched by a reactive ion etching method.

23. The method for producing a solar cell according to claim 18, wherein said obstacle is made of one kind or a combination of two or more kinds selected from a group consisting of materials (a), (b), and (c) as follows:

(a) a glass-based material;
(b) a metal material; and
(c) a resin material.

24. The method for producing a solar cell according to claim 23, wherein said metal material is an aluminum-based material.

* * * * *